United States Patent
Surprenant et al.

(10) Patent No.: US 6,500,751 B2
(45) Date of Patent: Dec. 31, 2002

(54) METHOD OF FORMING RECESSED THIN FILM LANDING PAD STRUCTURE

(75) Inventors: Richard Philip Surprenant, Poughkeepsie, NY (US); Edward Sumner Begle, Middletown, NY (US); Nancy Wagner Hannon, Wappingers Falls, NY (US); Mathias Pierre Jeanneret, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/772,205

(22) Filed: Jan. 29, 2001

(65) Prior Publication Data

US 2002/0146900 A1 Oct. 10, 2002

(51) Int. Cl.$^7$ .......................................... H01L 21/4763
(52) U.S. Cl. ....................... 438/622; 438/623; 438/612; 438/637; 438/672
(58) Field of Search ................................. 438/622–624, 438/612, 637–640, 672–673, 675

(56) References Cited

U.S. PATENT DOCUMENTS

| 5,494,853 | | 2/1996 | Lur | |
| 5,567,643 | * | 10/1996 | Lee et al. | 438/453 |
| 5,716,218 | | 2/1998 | Farnsworth et al. | 438/15 |
| 5,719,695 | * | 2/1998 | Heimbuch | 359/291 |
| 5,834,365 | | 11/1998 | Liu et al. | 438/612 |
| 5,861,344 | | 1/1999 | Roberts et al. | 438/738 |
| 5,891,799 | * | 4/1999 | Tsui | 438/624 |
| 5,956,612 | | 9/1999 | Nguyen et al. | 438/657 |
| 5,998,295 | | 12/1999 | Madurawe | 438/666 |
| 6,013,547 | | 1/2000 | Liaw | 438/238 |
| 6,184,121 | * | 2/2001 | Buchwalter et al. | 257/522 |

* cited by examiner

Primary Examiner—Tuan H. Nguyen
Assistant Examiner—Thanh Nguyen
(74) Attorney, Agent, or Firm—Ira D. Blecker; Graham S. Jones, II (57) ABSTRACT

A multilayer thin film via landing pad structure includes a thin film conductor structure with a recessed landing pad formed between an upper layer of polyimide dielectric and a lower layer of polyimide dielectric. A multilayer thin film via landing pad structure is formed on a lower layer of dielectric having a top surface. A depression is formed in the top surface of the lower layer of dielectric. The depression has a bottom within the lower layer. A recessed landing pad comprising a conductor is formed in the depression on the surface of the lower layer of dielectric. A conductor line is formed on the lower layer of dielectric in contact with the recessed landing pad. An upper layer of dielectric is formed over the lower layer of dielectric, the thin film conductor line and the recessed landing pad. A conductive via is formed extending through the upper layer of dielectric into contact with the recessed landing pad. Both the recess and the via are formed by laser ablation with the identical mask and laser ablation tool.

32 Claims, 4 Drawing Sheets

METHOD OF FORMING RECESSED THIN FILM LANDING PAD STRUCTURE

BACKGROUND OF THE INVENTION

1. Field of the Invention

This invention relates to interconnection between wiring in multilayer electrical and electronic devices and more particularly to via interconnections and methods of manufacture thereof.

2. Description of Related Art

U.S. Pat. No. 5,716,218 of Farnsworth et al. for "Process for Manufacturing an Interconnect for Testing a Semiconductor Die" shows a structure, and a process of manufacture of a compliant interconnect wherein a series of contacts are formed conformally over an undulating insulator layer with tapered side walls where the structure shape is optimized for the ability to connect to another electrical component.

U.S. Pat. No. 5,861,344 of Roberts et al. for "Facet Edge for Improved Step Coverage of Integrated Circuit Contacts" describes a structure and a method for providing a facet etch to improve step coverage where two conductive layers converge at and in a via hole; and over at least one layer of insulation to improve the structural integrity of a via having a fixed geometry. The contact area, and thus the maximum potential electrical performance are not increased.

U.S. Pat. No. 5,998,295 of Madurawe for "Method of Forming a Rough Region on a Substrate" describes a method of forming a rough region over a substrate, where a metal line converges into a contact over at least one layer of insulation. Methods are described for creating variations in topology of a semiconductor surface for the sole purpose of achieving optical reference points on an otherwise flat surface to enable visual alignment for process tooling. The patent does not relate to any electrical properties of the semiconductor.

U.S. Pat. No. 6,013,547 of Liaw for "Process for Creating a Butt Contact Opening for a Self-Aligned Contact Structure" describes a method of forming a metal connection (via a butt contact opening) between a gate structure and active semiconductor devices. The process of Liaw is employed primarily for manufacturing MOSFET SRAM (N type and P type) devices. After the devices and gates are constructed a step of etching by RIE with methyl trifluoride gas ($CHF_3$) is used to remove silicon oxide capping the gate structures to make openings for connection to the gates of FET devices. There is a process problem that the invention addresses, which is the undesired removal, during the silicon oxide RIE step, of portions of lightly doped source and drain regions in addition to removal of areas of device isolation insulators. The Liaw patent teaches applying an organic layer, polyimides or BARC (bottom anti-reflective coatings), over the layer before RIE etching the butt contact opening. The organic layer then protects the source and drain regions as well as the insulator areas during RIE of the silicon oxide. The organic and silicon oxide are removed at different rates in RIE, in addition various RIE chemistries can be used to control removal rates. The Liaw patent describes a method of protecting areas of the structure from removal during connection formation, but it does not describe a way to increase the bottom contact area. No patterning is done to layers below the layer being processed to enhance connection area, which one of the key features of the present invention. The Liaw patent describes a sequence of process steps that may be used on the layer being processed to control the area where material is removed. In summary, the Liaw patent describes a way to limit the regions where material is removed during device connection formation.

U.S. Pat. No. 5,834,365 of Ming-Tsung Liu et al. for a "Method of Forming a Bonding Pad" describes method of bonding, where, a plurality of metal layers converge over an undulating insulator layer and forms an additional bond area (pad) by creating metal features on the layer below. These features replicate up into the bond pad. The features used to increase bond area use real estate that could otherwise be used for active features. This technique would potentially reduce wireability. The Liu et al. patent builds features with some photolithography and metallization steps, to get features on a fine enough scale to affect the via areas we have would require semiconductor manufacturing processes. Features that fine would be totally planarized by polyimide insulators as thick as are used in Thin Film (TF) packaging. It appears that the bonding pad described applies to features in the 100's of microns, but does not apply to features in the 10's of microns. It probably cannot be used in internal wiring levels, there may not be "free" space to build the topography enhancement features in internal wiring levels.

See U.S. Pat. No. 5,494,853 of Lur for "Method to Solve Holes in Passivation by Metal Layout" and U.S. Pat. No. 5,956,615 of Nguyen et al. for "Method of Forming a Metal Contact to Landing Pad Structure in an Integrated Circuit."

Figure 1A:
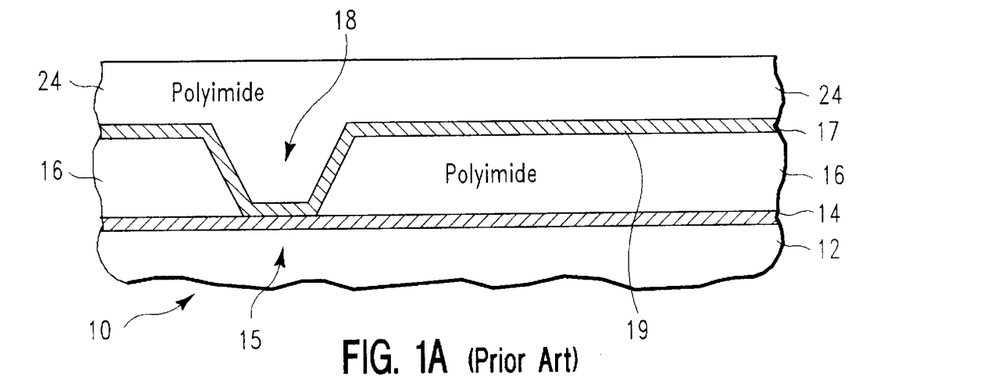
FIGS. 1A–1C are cross-sectional views of sequence of steps in the manufacture of a device which illustrate a Prior Art method of forming a thin film via through a polyimide layer to provide interconnection between two wiring lines.
Figure 1B:
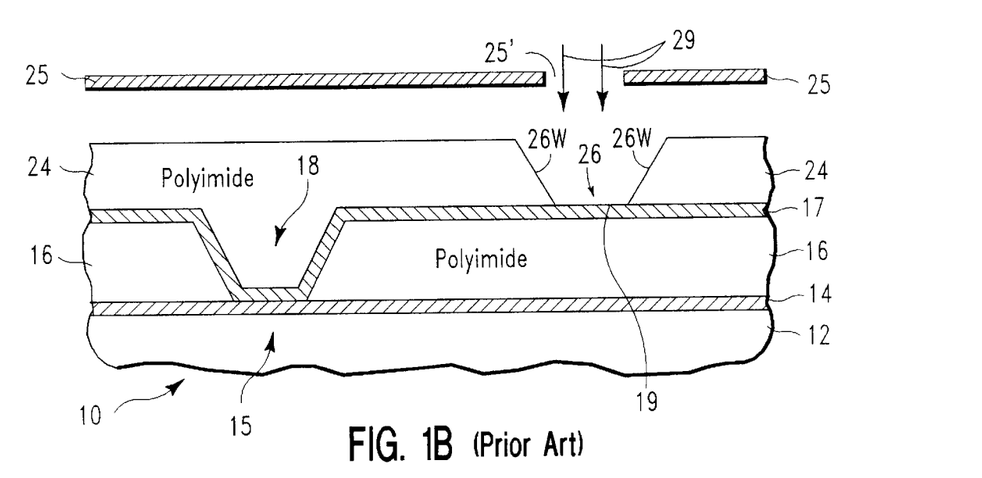
Figure 1C:
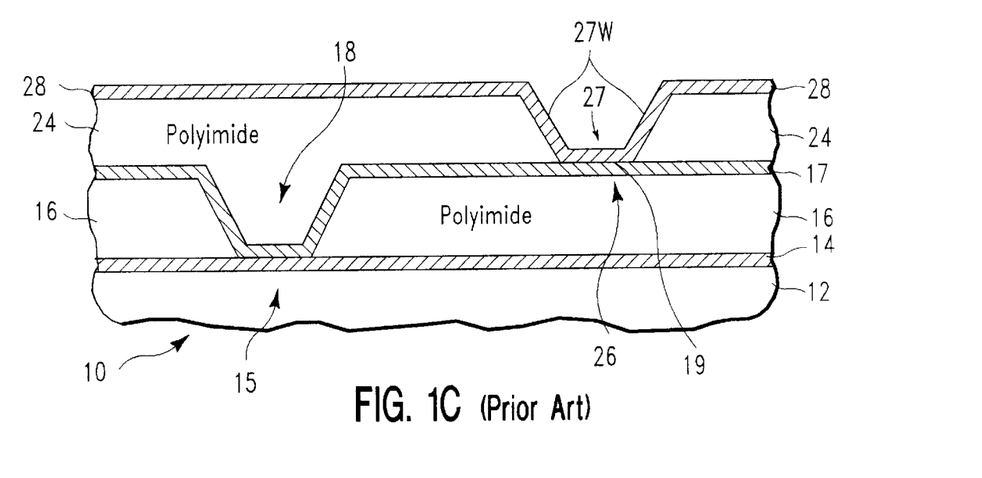

FIGS. 1A–1C are cross-sectional views of sequence of steps in the manufacture of a device 10 which illustrate a Prior Art method of forming a thin film via 27 (FIG. 1C) through a polyimide layer 24 which provides interconnection between a top conductor line 28 above an upper polyimide layer 24 and another conductor line 17 below the polyimide layer 24.

In FIG. 1A, a Prior Art device 10 is shown in an intermediate stage of fabrication. Device 10 is formed on a planar substrate 12 composed of a non-conductive material such as undoped silicon semiconductor material or a dielectric material. Initially, a first conductor line 14, which comprises a thin metal film is formed on the planar surface of the substrate 12. Then a planar, first polyimide layer 16 was formed covering the first conductor line 14 as well as the exposed surface of the substrate 12. However, subsequent to formation of planar, first polyimide layer 16, a via hole 15 therethrough was filled with the metallization of a via 18 which was formed through the first polyimide layer 16. The via hole 15 reached down to expose a portion of the conductor line 14. Then, an intermediate, second, conductor line 17 was formed on the surface of the planarized, first polyimide layer 16 reaching down into the via hole 15 to form the via 18 with the intermediate, second, conductor line 17 in electrical and mechanical contact with first conductor line 14. As will be well understood by those skilled in the art, a widened area of the line segment 17, often referred to as a landing pad 19 is formed in a line segment where a second via 27 is to be formed. As shown the line 17 and the metal landing pad 19 are planar and are formed on the flat planar surface of the polyimide layer 16 so that from the cross-sectional view in FIGS. 1B and 1C no recognizable difference its configuration or thickness can be discerned. Then a planarized, second polyimide layer 24 was formed covering the intermediate, second, conductor line 17 and the exposed surface of the first polyimide layer 16.

In FIG. 1B, the device of FIG. 1A is shown after a via hole 26 with sidewalls 26W has been formed through the second polyimide layer 24 exposing a portion of the surface of the intermediate, second, conductor line 17, which comprises a thin metal film. The via hole 26 with sidewalls 26W has been formed by ablation with an excimer laser beam 29 passing through opening 25' in a laser mask 25 which blocks the laser beam 29 from reaching other portions of the device 10. The etching of the second polyimide layer 24 by the laser beam 29 was stopped at the time at which the top surface of conductor line 17 was exposed. The via 26 hole and via 27 may be formed at the terminating end of line 17.

In FIG. 1C, the device 10 of FIG. 1B is shown after a third conductor line 28 was formed on the surface of the planarized, second polyimide layer 24 reaching down to form a second via 27 with sidewalls 27W over the sidewalls 26W of the via hole 26. The third conductor line 28 is in electrical and mechanical contact with the intermediate, second, conductor line 17. The location of an ablated hole 26 in which the via 27 is formed is located over the widened area of the line segment 17 comprising the landing pad 19.

SUMMARY OF THE INVENTION

While the Liaw patent, above, describes a method of protecting areas of the structure from removal during connection formation, it does not describe a way to increase bottom contact area as does the present invention. No patterning is done to layers below the layer being processed to enhance connection area, which one of the key features of the present invention. Unlike Liaw, the present invention describes a way to increase via connection area, without increasing via diameters or loosening ground rules.

The contact area, and the maximum potential electrical performance is increased by the present invention which increases the via contact area, providing a robust connection with increased contact area and thus enhanced electrical properties.

The present invention creates additional via area by ablating the polyimide under the via, without affecting features sizes, ground rules or free active area.

Current landing pads for thin film vias are flat. Increasing via contact area will result in a more reliable connection modifications to existing via ablation (widening the ablation) will increase via contact at the expense of capture criteria In accordance with this invention, partially ablate the polyimide at subsequent via locations using the next via mask at the same level as the current vias are created masks are already available little added cycle time. Modifications to current ablation criteria fill the landing zone, without sacrificing the capture criteria with. That modification is required to account for deeper penetration depth due to the recess.

Further in accordance with this invention, a method of fabricating a via connection between two conductor lines formed above and below an insulating material comprises the following steps.

Form a recess in a top surface of a lower layer which is electrically relatively non-conductive or dielectric.

Form a first conductor line on the top surface of the lower layer reaching over at least a portion of the recess.

Form an upper layer composed of a dielectric material over the top surface of the lower layer and covering the first conductor line at least within the proximity of the recess.

Form a via hole reaching down toward the recess exposing the surface of the conductor line above the recess.

Form an intermediate, second, conductor line reaching down into the via hole into contact with the first conductor line above the recess.

Preferably, the lower layer and the upper layer comprise polymeric materials such as polyimide; the recess and the via are both formed by laser ablation of the lower layer and the same laser mask is employed for forming the recess and for forming the via; the recess has tapered walls and has a bottom within the lower layer; the via hole is formed by laser ablation of a hole through the upper layer having tapered walls and having a bottom exposing the intermediate, second, conductor line; the lower layer and the upper layer consist of polyimide material having a thickness of from about 7–10 micrometers.

Preferably, the laser ablation of the via hole is performed with a xenon/chlorine excimer laser in accordance with the parameters as follows:

| | |
|---|---|
| Wavelength: | 308 nanometers |
| Hertz: | 300 pulses per second |
| Pulse duration: | roughly 20 nanoseconds |
| Fluence: | 190 millijoules per square centimeter |
| Number of pulses: | 300 | and the laser ablation of the recess is performed with a xenon/chlorine excimer laser in accordance with the parameters as follows:

| | |
|---|---|
| Wavelength: | 308 nanometers |
| Hertz: | 300 pulses per second |
| Pulse duration: | roughly 20 nanoseconds |
| Fluence: | 190 millijoules per square centimeter |
| Number of pulses: | 20 |

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

FIGS. 2A–2G are a series of cross-sectional views of a process of forming a via in a thin film device in accordance with this invention. FIGS. 2A-2G show the process of manufacturing a device 40 which illustrates the sequence of steps of the method of this invention.

Figure 2A:
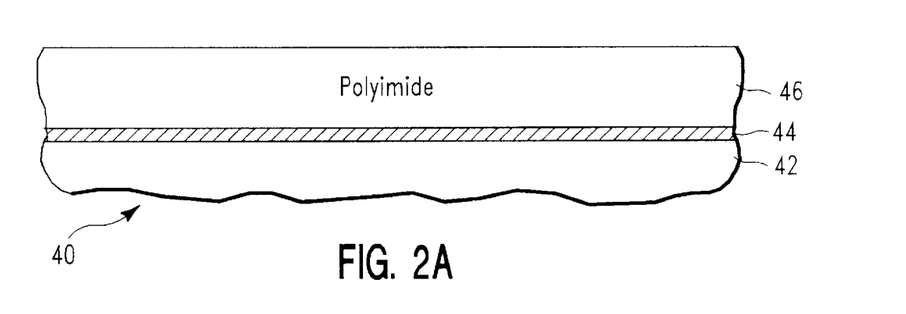
FIGS. 2A–2G are a series of cross-sectional views of a sequence of steps in the manufacture of a thin film device producing an improved via in a device in accordance with this invention.
Figure 2B:
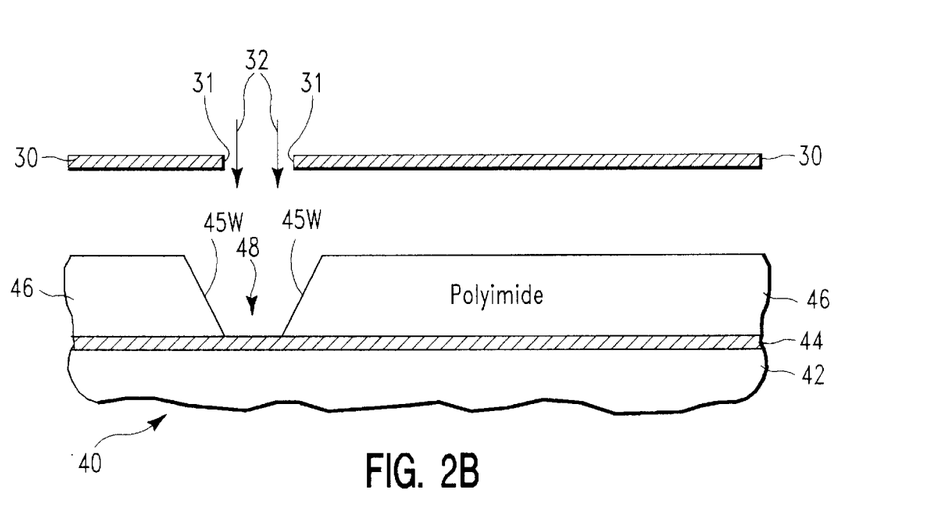
Figure 2C:
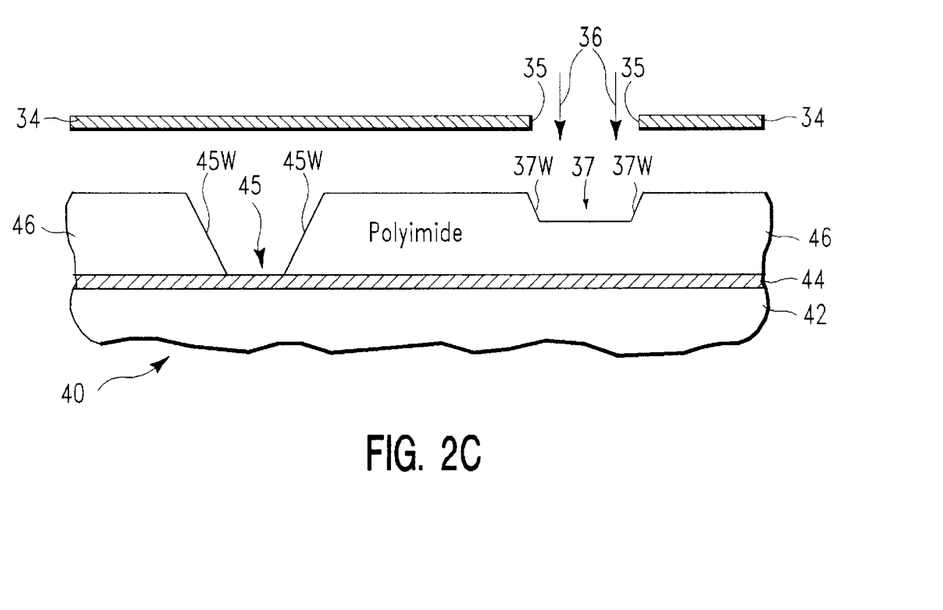
Figure 2D:
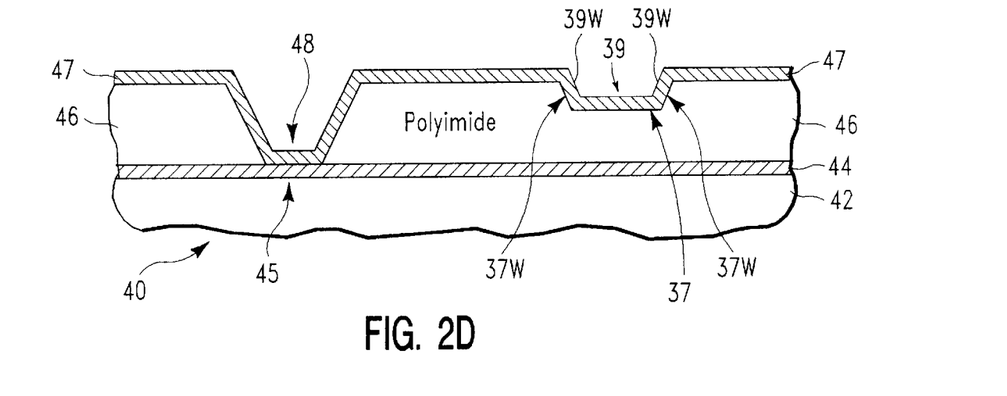
Figure 2E:
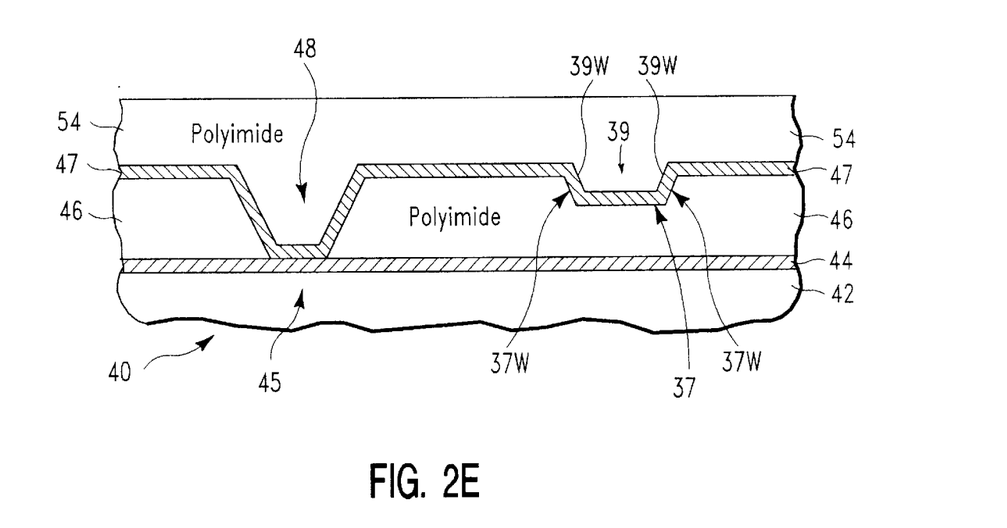
Figure 2F:
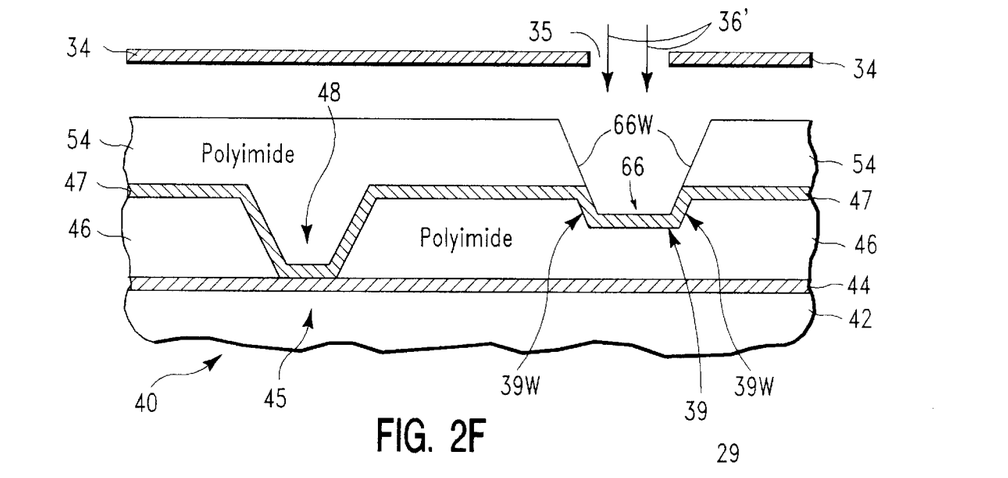
Figure 2G:
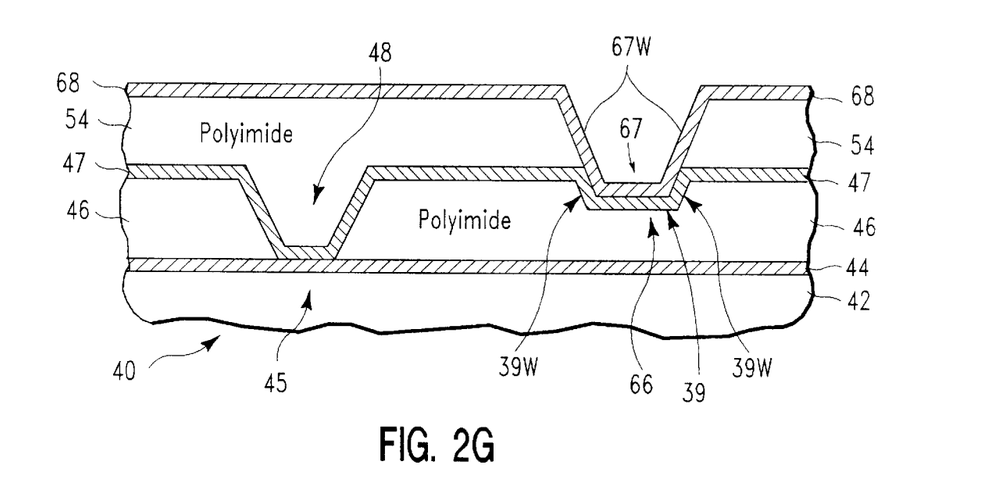

The product seen in FIG. 2G yields an improved thin film upper via 67 in accordance with this invention. The upper via 67 extends through a polymeric material layer 54 which provides interconnection between a top conductor line 58 above the upper polymeric layer 54 and intermediate conductor line 47 below the upper polymeric layer 54. In this preferred embodiment, the polymeric layer 54 is polyimide, so hereinafter the polymeric layer 54 will be referred to as polyimide which is a superior material for supporting and encapsulating electrically conductive elements especially in semiconductor packages and semiconductor elements. An alternative to polyimide is epoxy.

FIGS. 2A–2G are a series of cross-sectional views of a device 40 which illustrate a sequence of steps employed in method of forming a thin film second, upper via 67 (FIG. 2G) through a planar, second, upper polyimide layer 54. Upper via 67 provides interconnection between a top, third conductor line 58 above the planar, upper polyimide layer 54 and the intermediate (second) conductor line 47 below the upper polyimide layer 54.

In FIG. 2A, the device 40 is shown in a relatively early intermediate stage of fabrication. Device 40 is formed on a planar substrate 42 composed of a non-conductive material such as undoped silicon semiconductor material or a dielectric material. Initially, a first conductor line 44, which comprises a thin metal film is formed on the planar surface of the substrate 42. Then a planar, first polyimide layer 46 was formed covering the first conductor line 44 as well as the exposed surface of the substrate 42. While the first conductor line 44 is shown parallel to the plane of the drawing, it can be directed at any angle on the top surface of substrate 42.

Referring to FIG. 2B, the device 40 of FIG. 2A is shown subsequent to formation, by a laser ablation step, of the planar, first polyimide layer 46 a first via hole 45 with sloping sidewalls 45W. The first via hole 45 reaches down through to the bottom of first polyimide layer 46 thereby exposing a portion of the first conductor line 44 which at the bottom of the first via hole 45. The first via hole 45 with sidewalls 45W has been formed by ablation with an excimer laser beam 32 passing through opening 31 through a mask 30 which blocks the laser beam 32 from reaching other portions of the first polyimide layer 46.

Referring to FIGS. 2C and 2F, this invention involves utilizing a laser ablation via mask 34 for forming a via hole 66 through an upper level polyimide layer 54 of device 40 to form a shallow recess 37/37W comprising a landing pad depression in a first/lower polyimide layer 46 at the location that a subsequent via 67 will be placed as seen in FIG. 2G.

Referring to FIG. 2C, the device 40 of FIG. 2B is shown subsequent to formation of the shallow recess 37 with sidewalls 37W (i.e., a depression in the surface of the first polyimide layer 46) by a second laser ablation step. The second laser ablation step is performed by an excimer laser beam 36 passing through opening 35 through a mask 34 which blocks the laser beam 36 from reaching other portions of the first polyimide layer 46. The bottom of the shallow recess 37 is substantially above the bottom of layer 46 and conductor 44 leaving an adequate thickness to provide electrical insulation between the recess 37 and conductor 44.

Referring to FIG. 2D, the device 40 of FIG. 2C is shown subsequent to formation of the intermediate (second) conductor line 47 composed of a thin film of metallization extending across the planarized, first polyimide layer 46 into the via hole 45/45W reaching down to contact the exposed portion of the conductor line 44 and forming a metal via pad 39/39W in the recess 37/37W of FIG. 2C. The intermediate (second) conductor line 47 reaches across sloping sidewalls 45W and across the bottom of first via hole 45 into contact with the first conductor line 44 to form a lower via 48 with the intermediate (second) conductor line 47 in electrical and mechanical contact with first conductor line 44. The intermediate (second) conductor line 47 also reaches across sloping sidewalls 37W and the bottom surface of the shallow recess 37 to form a metal landing pad 39 for a upper via 67 which is to be formed in a subsequent step as shown in FIG. 2G. The intermediate (second) conductor line 47 is shown parallel to the plane of the drawing which has been selected to be in the plane which reveals the connections of intermediate (second) conductor line 47 to vias 45 and 67.

As will be well understood by those skilled in the art, metal landing pad 39 comprises a widened segment (area) of the intermediate (second) conductor line 47 where the upper via 67 is to be formed. As shown the intermediate (second) line 47 and the metal landing pad 39 are planar and are formed on the flat planar surface of the polyimide layer 46 so that no recognizable difference its configuration or thickness can be discerned in the cross-sectional views seen in FIGS. 2D–2G.

Referring to FIG. 2E, the device 40 of FIG. 2D is shown subsequent to formation of a planarized, second polyimide layer 54 covering the intermediate (second) conductor line 47 and the exposed surfaces of the first polyimide layer 46.

In FIG. 2F, the device of FIG. 2E is shown after a via hole 66 with sidewalls 66W has been formed through the second polyimide layer 54 exposing a portion of the surface of the intermediate (second) conductor line 47, which comprises a thin metal film. The via hole 66 with sidewalls 66W has been formed by ablation with virtually the same excimer laser beam 36' as in FIG. 2C passing through the same opening 35 through the same mask 34 as in FIG. 2C. Mask 34 is reused in the step illustrated by FIG. 2F to assure correct alignment and to minimize mask preparation expense. As in FIG. 2C, mask 34 blocks the laser beam 36' from reaching other portions of the device 40. The ablation of the second polyimide layer 54 by the laser beam 36' was stopped at the time at which the top surface of intermediate (second) conductor line 47 was exposed. The via 66 hole (and upper via 67 shown in FIG. 2G) may be formed at the terminating end of intermediate (second) conductor line 47.

In FIG. 2G, the device 40 of FIG. 2F is shown after a third conductor line 68 was formed on the surface of the planarized, second polyimide layer 54 reaching down across sidewalls 66W into via hole 66 to form a second upper via 67 with sidewalls 67W extending over the sidewalls 66W of the via hole 66. The upper (third) conductor line 68 is in electrical and mechanical contact with the intermediate (second) conductor line 47. The location of an ablated hole 66 in which the upper via 67 is formed is located over the widened area of the intermediate (second) conductor line segment 47 comprising the metal landing pad 39. While the third conductor line 68 is shown parallel to the plane of the drawing it can be directed at any angle on the top surface of second polyimide layer 54 just so long as it traverses the via opening 66 thereby forming the upper via 67.

Process Parameters for Laser Ablation to Form Vias and to Form Recessed Landing Pads In practicing the above process/method of this invention, the preferred methods of forming via holes 66 through a polyimide layer 54 in FIGS. 2B/2F and/or forming landing pad recesses 37 in FIG. 2C are described in Tables I and II below respectively.

TABLE I

Via hole ablation process: Laser- Xe/Cl (Xenon/Chlorine) pulsed Excimer Laser

| | |
|---|---|
| Wavelength | 308 nanometers |
| Hertz: | 300 pulses per second |
| Pulse duration: | roughly 20 nanoseconds |
| Fluence: | 190 millijoules per square centimeter |
| Number of pulses: | 300 |
| Typical thickness of the ablated | 7–10 microns |

TABLE I-continued

Via hole ablation process: Laser- Xe/Cl (Xenon/Chlorine) pulsed Excimer Laser polyimide polymer for via ablation
on a product

TABLE II

Ablation process for Recessed/Depressed Landing Pad for via interface
Laser: Xe/Cl (Xenon/Chlorine) pulsed Excimer Laser

| | |
|---|---|
| Wavelength | 308 nanometers |
| Hertz: | 300 pulses per second |
| Pulse duration: | roughly 20 nanoseconds |
| Fluence: | 190 millijoules per square centimeter |
| Number of pulses: | 20 |

As can be seen, the ratio of the number of pulses for formation of a recess to the number of pulses for forming a via hole is (300/20=15) which means that the ratio is greater than an order of magnitude.

To create a landing pad recess/depression 37 in FIG. 2C in the polyimide layer 46 to be located under an upper via 67 (which upper via 67 is to be formed thereabove subsequently), the number of pulses was limited to 20, all other parameters were the same as a normal ablation process.

Typical ablation etch rates of polyimides used on line at 308 nm are 0.06 to 0.08 microns per pulse. Twenty (20) pulses resulted in a recess/depression 37 in FIG. 2C approximately 1.5 microns deep.

Advantages of the Present Invention

This method and structure of this invention results in significantly more metal contact area in each via (e.g. a 30% increase in contact area). The structure also provides a much more stable interface, eliminating a sharp interface structure while also geometrically isolating the line to reduce thermal stress effects. Via defects are a consistent source of defects which either result in the loss of assets (scrap) or significant rework.

This invention results in better metal-to-metal contact between line 68 and intermediate (second) conductor line 47 at upper via 67 in FIG. 2G by increasing the area of contact because intermediate (second) conductor line of the increased surface area created by the formation of the recess/depression with its tapered sidewalls 66W/67W. It also allows the metal line 68 to make contact to intermediate (second) conductor line 47 at a low angle of incidence, significantly reducing the stress effects which lead to subsequent via failure.

Since via defects are a main yield detractor in processing of thin film devices, this enhanced contact structure and method provide a significant advance in the state of the art.

Figure 3:
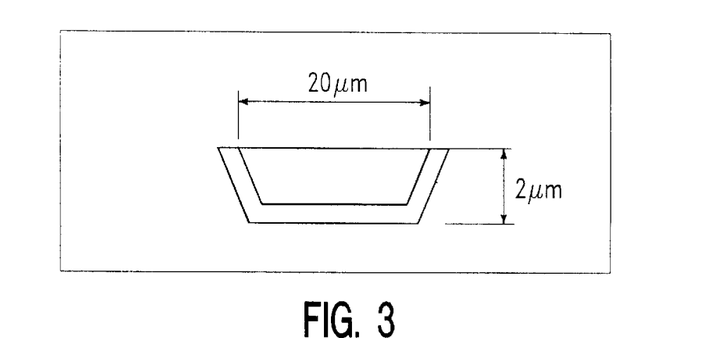
FIG. 3 is a sketch of the parameters of a cross section of landing pad in accordance with this invention.

FIG. 3 is a sketch of the parameters of a cross section of landing pad in accordance with this invention. The benefits of the present invention are increased yield/cycle time due to fewer via related Electric Module Tester (EMT) defects are better contact between levels due to greater contact area (approximately 25%) 25% based on comparing the contact area of a flat circular area (diameter=20 $\mu$m) to that obtained by calculating the area of a rotated trapezoid shown in FIG. 3 with a width of 20 $\mu$m and a height of 2 $\mu$m. The total via area results have been calculated to be: 40.75 mm$^2$ vs. 32.56 mm$^2$. The actual contact area approaches estimate as metal thickness becomes a thinner more stable structure due to anchoring of line at the via location in the recess.

While this invention has been described in terms of the above specific embodiment(s), those skilled in the art will recognize that the invention can be practiced with modifications within the spirit and scope of the appended claims, i.e., that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a multilayer thin film via landing pad structure starting with a lower layer of dielectric having a top surface comprising:

forming a depression in the top surface of the lower layer of dielectric, the depression having a bottom within the lower layer, said depression extending only partly through the lower layer, forming a recessed landing pad comprising a conductor in the depression on the surface of the lower layer of dielectric, forming a conductor line on the lower layer of dielectric in contact with the recessed landing pad, forming an upper layer of dielectric over the lower layer of dielectric, the thin film conductor line and the recessed landing pad, and forming a conductive via extending through the upper layer of dielectric into contact with the recessed landing pad, the recessed landing pad thereby having increased contact with the conductive via.

2. The method of claim 1 wherein the upper layer of dielectric and the lower of dielectric comprise polymeric materials.

3. The method of claim 1 wherein the step of forming the depression in the top surface of the lower layer of dielectric is performed by laser ablation.

4. The method of claim 1 wherein:

the layers of dielectric comprise polymeric materials, and the step of forming the depression is performed by laser ablation of the lower layer.

5. The method of claim 1 wherein:

the layers of dielectric comprise polymeric materials, the step of forming the depression is performed by laser ablation of the lower layer, and a laser mask is employed for forming the depression and the same laser mask is employed again for forming the via.

6. The method of claim 1 wherein:

the lower layer comprises a polyimide material, the step of forming the depression is performed by laser ablation of the lower layer, and the step of forming the via hole is performed by laser ablation of a hole through the upper layer of polyimide material over the depression with a bottom aligned with the depression.

7. The method of claim 1 wherein the step of forming the depression is performed by laser ablation of a depression into the top surface of the lower layer forming a depression having tapered walls and having a bottom within the lower layer.

8. The method of claim 1 wherein the step of forming the depression is performed by laser ablation of a depression into the top surface of the lower layer forming a depression having tapered walls and having a bottom within the lower layer, and     a laser mask is employed for forming the depression and the same laser mask is employed again for forming the via.

9. The method of claim 1 wherein:

the layers of dielectric comprise polymeric materials, and the step of forming the depression is performed by laser ablation of a depression into the top surface of the lower layer forming a depression having tapered walls and having a bottom within the lower layer.

10. The method of claim 9 wherein the lower layer and the upper layer comprise polymeric materials, the step of forming the recess is performed by laser ablation of the lower layer, and the same laser mask is employed for forming the recess and for forming the via.

11. The method of claim 1 wherein:

the dielectric layers comprise polymeric materials, and the step of forming the depression is performed by laser ablation of a depression into the top surface of the lower layer forming a depression having tapered walls and having a bottom within the lower layer, and a laser mask is employed for forming the depression and the same laser mask is employed again for forming the via.

12. The method of claim 1 wherein:

the dielectric layers comprise polyimide material, and the step of forming the depression is performed by laser ablation of a depression into the top surface of the lower layer forming a depression having tapered walls and having a bottom within the lower layer.

13. The method of claim 1 wherein:

the lower layer and the dielectric material comprise polyimide material, the step of forming the depression is performed by laser ablation of a depression into the top surface of the lower layer forming a depression having tapered walls and having a bottom within the lower layer, and a laser mask is employed for forming the depression and the same laser mask is employed again for forming the via.

14. The method of claim 1 wherein:

the dielectric layers consist of polyimide material, the step of forming the depression is performed by laser ablation of a depression into the top surface of the lower layer forming a depression having tapered walls and having a bottom within the lower layer, and the step of forming the via hole is performed by laser ablation of a via hole through the upper layer, the hole having tapered walls and having a bottom exposing a lower conductor line extending across the recessed landing pad.

15. The method of claim 1 wherein:

the dielectric layers consist of polyimide material, the step of forming the depression is performed by laser ablation of a depression into the top surface of the lower layer forming a depression having tapered walls and having a bottom within the lower layer, the step of forming the via hole is performed by laser ablation of a hole through the upper layer having tapered walls and having a bottom exposing the intermediate conductor line, and a laser mask is employed for forming the depression and the same laser mask is employed again for forming the via.

16. The method of claim 1 wherein:

the lower layer and the upper layer consist of polyimide material having a thickness of from about 7–10 micrometers, the step of forming the depression is performed by laser ablation of a depression into the top surface of the lower layer forms a depression having tapered walls and having a bottom within the lower layer, the step of forming the via hole is performed by laser ablation of a via hole through the upper layer tapered walls and having a bottom exposing the intermediate conductor line and the laser ablation of the via hole is performed with a xenon/chlorine excimer laser in accordance with the parameters as follows:
Wavelength: 308 nanometers
Hertz: 300 pulses per second
Pulse duration: roughly 20 nanoseconds
Fluence: 190 millijoules per square centimeter, and
Number of pulses: 300; and the laser ablation of the depression is performed with a xenon/chlorine excimer laser in accordance with the parameters as follows:
Wavelength: 308 nanometers
Hertz: 300 pulses per second
Pulse duration: roughly 20 nanoseconds
Fluence: 190 millijoules per square centimeter, and
Number of pulses: 20.

17. The method of claim 16 wherein a laser mask is employed for forming the depression and the same laser mask is employed again for forming the via.

18. A method of fabricating a via connection between two conductor lines formed above and below an insulating material comprising the following steps:

forming a recess in a top surface of a lower layer which is electrically relatively nonconductive or dielectric, said recess extending only partly through the lower layer, forming a first conductor line on the top surface of the lower layer reaching over at least a portion of the recess, forming an upper layer composed of a dielectric material over the top surface of the lower layer and covering the first conductor line at least within the proximity of the recess, forming a via hole reaching down towards the recess exposing the surface of the conductor line above the recess, and forming an intermediate conductor line reaching down into the via hole into contact with the first conductor line above the recess, the recessed first conductor line thereby having increased contact with the intermediate conductor line in the via hole.

19. The method of claim 18 wherein the lower layer and the upper layer comprise polymeric materials.

20. The method of claim 18 wherein the step of forming the recess is performed by laser ablation of a depression into the top surface of the lower layer forming a recess with a bottom within the lower layer.

21. The method of claim 18 wherein:

the lower layer and the upper layer comprise polymeric materials, and the step of forming the recess is performed by laser ablation of the lower layer.

22. The method of claim 18 wherein:

the lower layer comprises a polyimide material, the step of forming the via hole is performed by laser ablation of a depression into the top surface of the polyimide material forming a recess with a bottom within the polyimide material.

23. The method of claim 18 wherein the step of forming the recess is performed by laser ablation of a depression into the top surface of the lower layer forming a recess having tapered walls and having a bottom within the lower layer.

24. The method of claim 18 wherein:

the step of forming the recess is performed by laser ablation of a depression into the top surface of the lower layer forming a recess having tapered walls and having a bottom within the lower layer, and the same laser mask is employed for forming the recess and for forming the via.

25. The method of claim 18 wherein:

the lower layer and the upper layer comprise polymeric materials, and the step of forming the recess is performed by laser ablation of a depression into the top surface of the lower layer forming a recess having tapered walls and having a bottom within the lower layer.

26. The method of claim 18 wherein:

the lower layer and the upper layer comprise polymeric materials, and the step of forming the recess is performed by laser ablation of a depression into the top surface of the lower layer forming a recess having tapered walls and having a bottom within the lower layer, and the same laser mask is employed for forming the recess and for forming the via.

27. The method of claim 18 wherein:

the lower layer and the upper layer comprise polyimide material, and the step of forming the recess is performed by laser ablation of a depression into the top surface of the lower layer forming a recess having tapered walls and having a bottom within the lower layer.

28. The method of claim 18 wherein:

the lower layer and the upper layer comprise polyimide material, the step of forming the recess is performed by laser ablation of a depression into the top surface of the lower layer forming a recess having tapered walls and having a bottom within the lower layer, and the same laser mask is employed for forming the recess and for forming the via.

29. The method of claim 18 wherein:

the lower layer and the upper layer consist of polyimide material, the step of forming the recess is performed by laser ablation of a depression into the top surface of the lower layer forms a recess having tapered walls and having a bottom within the lower layer, and the step of forming the via hole is performed by laser ablation of a hole through the upper layer tapered walls and having a bottom exposing the intermediate conductor line.

30. The method of claim 18 wherein:

the lower layer and the upper layer consist of polyimide material, the step of forming the recess is performed by laser ablation of a depression into the top surface of the lower layer forms a recess having tapered walls and having a bottom within the lower layer, the step of forming the via hole is performed by laser ablation of a hole through the upper layer tapered walls and having a bottom exposing the intermediate conductor line, and the same laser mask is employed for forming the recess and for forming the via.

31. The method of claim 18 wherein:

the lower layer and the upper layer consist of polyimide material having a thickness of from about 7–10 micrometers, the step of forming the recess is performed by laser ablation of a depression into the top surface of the lower layer forms a recess having tapered walls and having a bottom within the lower layer, the step of forming the via hole is performed by laser ablation of a hole through the upper layer tapered walls and having a bottom exposing the intermediate conductor line and the laser ablation of the via hole is performed with a xenon/chlorine excimer laser in accordance with the parameters as follows:
Wavelength: 308 nanometers,
Hertz: 300 pulses per second,
Pulse duration: roughly 20 nanoseconds,
Fluence: 190 millijoules per square centimeter,
Number of pulses: 300; and the laser ablation of the recess is performed with a xenon/chlorine excimer laser in accordance with the parameters as follows:
Wavelength: 308 nanometers,
Hertz: 300 pulses per second,
Pulse duration: roughly 20 nanoseconds,
Fluence: 190 millijoules per square centimeter, and
Number of pulses: 20.

32. The method of claim 31 wherein the same laser mask is employed for forming the recess and for forming the via.

* * * * *